(12) United States Patent
Zhu et al.

(10) Patent No.: US 7,288,488 B2
(45) Date of Patent: Oct. 30, 2007

(54) METHOD FOR RESIST STRIP IN PRESENCE OF REGULAR LOW K AND/OR POROUS LOW K DIELECTRIC MATERIALS

(75) Inventors: Helen Zhu, Fremont, CA (US); Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 292 days.

(21) Appl. No.: 11/126,648

(22) Filed: May 10, 2005

(65) Prior Publication Data

US 2006/0258148 A1 Nov. 16, 2006

(51) Int. Cl.
*H01L 21/461* (2006.01)
(52) U.S. Cl. .............. 438/726; 257/E21.259; 257/E21.264; 430/256
(58) Field of Classification Search ........ 257/E21.259, 257/E21.264; 430/256; 438/726
See application file for complete search history.

(56) References Cited

U.S. PATENT DOCUMENTS

| | | | |
|---|---|---|---|
| 6,242,350 B1 * | 6/2001 | Tao et al. ............ | 438/690 |
| 6,316,354 B1 | 11/2001 | Hu | |
| 6,455,431 B1 * | 9/2002 | Hsieh et al. .......... | 438/691 |
| 6,647,994 B1 * | 11/2003 | Lui et al. ............. | 134/1.2 |
| 6,777,344 B2 | 8/2004 | Annapragada et al. | |
| 2001/0008803 A1 * | 7/2001 | Takamatsu et al. .... | 438/706 |
| 2002/0111041 A1 * | 8/2002 | Annapragada et al. .. | 438/784 |
| 2002/0127840 A1 * | 9/2002 | Smith et al. .......... | 438/618 |
| 2004/0005517 A1 * | 1/2004 | Gu et al. .............. | 430/314 |
| 2006/0040474 A1 * | 2/2006 | Shieh et al. .......... | 438/474 |

* cited by examiner

*Primary Examiner*—Asok Kumar Sarkar
(74) *Attorney, Agent, or Firm*—Martine Penilla & Gencarella, LLP

(57) ABSTRACT

A two-step process is disclosed for stripping photoresist material from a substrate, wherein the substrate includes a low k dielectric material underlying the photoresist material and a polymer film overlying both the photoresist material and the low k dielectric material. The first step of the two-step process uses an oxygen plasma to remove the polymer film. The second step of the two-step process uses an ammonia plasma to remove the photoresist material, wherein the second step commences after completion of the first step. Each step of the two-step photoresist stripping process is respectively defined by particular values for process parameters including chemistry, temperature, pressure, gas flow rate, radio frequency power and frequency, and duration.

20 Claims, 6 Drawing Sheets

Pre-Strip

Pre-Strip

Post-Strip

Post-Strip

Post-Dip

Post-Dip

METHOD FOR RESIST STRIP IN PRESENCE OF REGULAR LOW K AND/OR POROUS LOW K DIELECTRIC MATERIALS

BACKGROUND

During semiconductor fabrication, integrated circuits are created on a semiconductor wafer ("wafer") composed of a material such as silicon. To create the integrated circuits on the wafer, it is necessary to fabricate a large number (e.g., millions) of electronic devices such as resistors, diodes, capacitors, and transistors of various types. Fabrication of the electronic devices involves depositing, removing, and implanting materials at precise locations on the wafer. A process called photolithography is commonly used to facilitate deposition, removal, and implantation of materials at precise locations on the wafer.

In the photolithography process, a photoresist material is first deposited onto the wafer. The photoresist material is then exposed to light filtered by a reticle. The reticle is generally a glass plate that is patterned with exemplary feature geometries that block light from passing through the reticle. After passing through the reticle, the light contacts the surface of the photoresist material. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After the exposure to the light, the soluble portions of the photoresist material are removed, leaving a patterned photoresist layer.

The wafer is then processed to either remove, deposit, or implant materials in the wafer regions not covered by the patterned photoresist layer. After the wafer processing, the patterned photoresist layer is removed from the wafer in a process called photoresist stripping. It is important to completely remove the photoresist material during the photoresist stripping process because photoresist material remaining on the wafer surface may cause defects in the integrated circuits. Also, the photoresist stripping process should be performed carefully to avoid chemically modifying or physically damaging underlying materials present on the wafer.

SUMMARY

In one embodiment, a method is disclosed for removing photoresist material from a substrate. The method includes an operation for providing a substrate having a photoresist material overlying a low k dielectric material, wherein both the photoresist material and the low k dielectric material have an overlying polymer film. The substrate can be defined either with or without a hardmask layer between the photoresist material and the low k dielectric material. The method also provides an operation for performing a first stripping process using an oxygen plasma to remove the polymer film. The method further provides an operation for performing a second stripping process after completion of the first stripping process. The second stripping process uses an ammonia plasma to remove the photoresist material. Both the first and second stripping processes are performed without adversely damaging or removing the underlying low k dielectric material, and without faceting the hardmask if present.

In another embodiment, a method is disclosed for removing photoresist material from a substrate. The method includes providing a substrate having a photoresist material overlying a low k dielectric material. Both the photoresist material and the low k dielectric material have an overlying polymer film that includes either a fluorocarbon component or a hydrofluorocarbon component. Additionally, the substrate can be defined either with or without a hardmask layer between the photoresist material and the low k dielectric material. The method also includes disposing oxygen gas over the substrate and transforming the oxygen gas into a reactive form, wherein the reactive form of oxygen affects a removal of the polymer film. Upon a substantially complete removal of the polymer film, the disposal of oxygen gas over the substrate is terminated. The method further includes disposing an ammonia gas over the substrate after terminating the disposal of oxygen gas over the substrate. The ammonia gas is transformed into a reactive form, wherein the reactive form of ammonia affects a removal of the photoresist material from the substrate without causing substantial damage or removal of the underlying low k dielectric material, and without faceting the hardmask if present.

In another embodiment, a method is provided for removing photoresist material from a substrate having a low k dielectric material underlying the photoresist material. Both the photoresist material and the low k dielectric material have an overlying polymer film that includes either a fluorocarbon or a hydrofluorocarbon component. In a first operation of the method, the polymer film is exposed to an oxygen plasma for a duration necessary to just remove the polymer film. Following removal of the polymer film, a second operation of the method is performed in which the photoresist material is exposed to an ammonia plasma for a duration necessary to completely remove the photoresist material.

Other aspects and advantages of the invention will become more apparent from the following detailed description, taken in conjunction with the accompanying drawings, illustrating by way of example the present invention.

DETAILED DESCRIPTION

Figure 1:
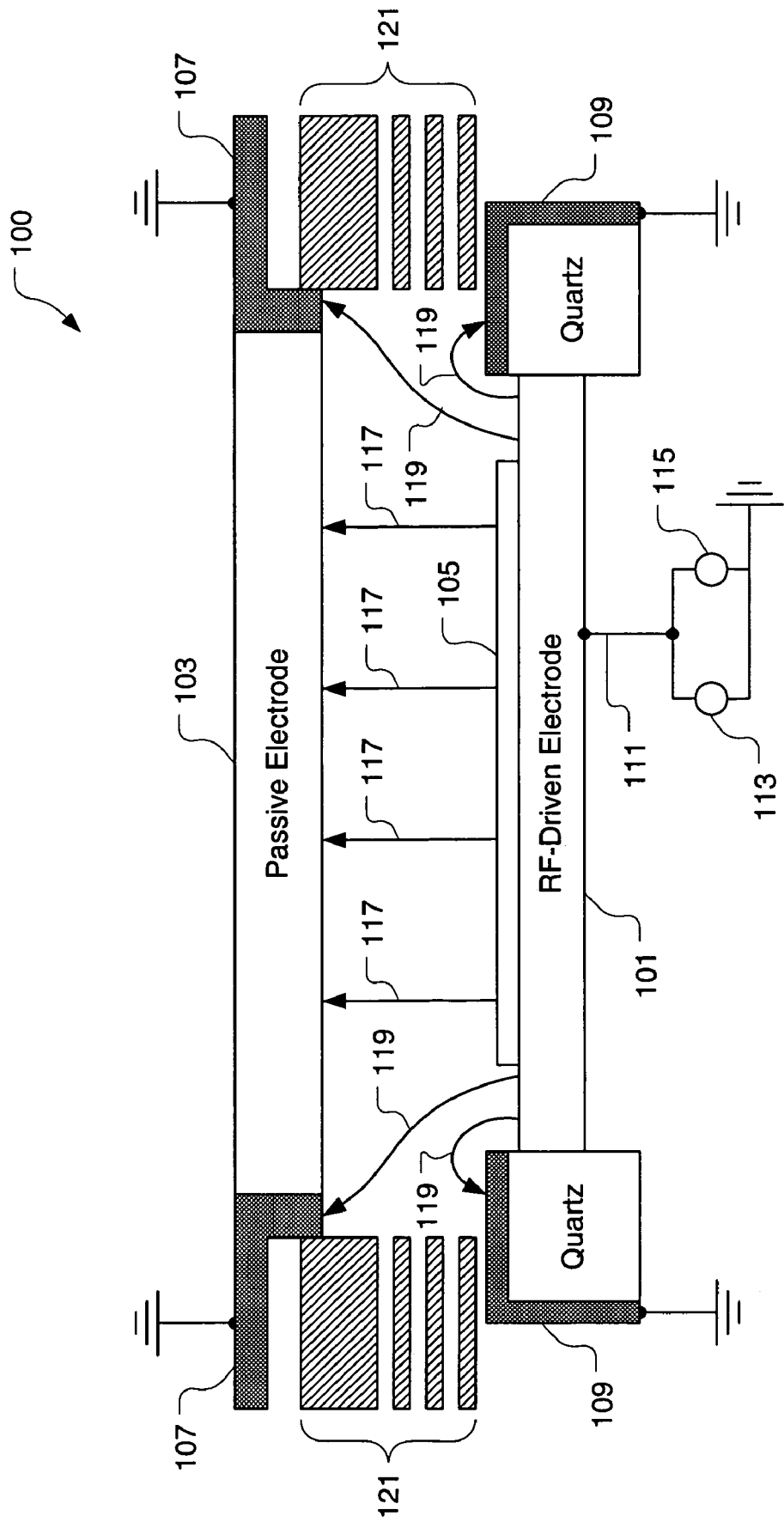
FIG. 1 is an illustration showing an exemplary plasma etching chamber, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Advanced integrated circuits often use a low k dielectric material as an electrical insulator between adjacent conductor lines, i.e., as an interlayer dielectric material. Low k dielectric materials are defined as insulating materials having a k value less than that of $SiO_2$, i.e., a k value less than about 3.9. For discussion purposes, low k dielectric materials having a dielectric constant value, i.e., k value, less than about 2.5 are considered "porous" low k materials. Additionally, low k dielectric materials having a dielectric constant value, i.e., k value, greater than or equal to about 2.5 are considered "dense" or "regular" low k materials. Use of the low k dielectric materials reduces undesired capacitive coupling, i.e., crosstalk, between adjacent conductor lines while increasing device speed. As used herein, the general term "low k dielectric material" refers to low k dielectric materials of either type, i.e., porous or dense/regular.

To form integrated circuit structures on a wafer, it is often necessary to subject the low k dielectric material to a plasma etching process. In plasma etching of a low k dielectric layer on a wafer, a photoresist mask layer is commonly used to form a mask pattern over the low k dielectric layer. The mask pattern serves to protect the underlying low k material from being removed during the plasma etching process. Once the plasma etching process is completed and the corresponding mask pattern is formed in the low k dielectric layer, the photoresist material and associated residue needs to be removed from the wafer. Also, it should be appreciated that once the plasma etching process is completed, portions of the remaining low k dielectric material will be exposed. Removal of the photoresist material from the wafer can be accomplished by performing a photoresist stripping process on the wafer. However, the photoresist stripping process needs to be performed in a manner that will not adversely affect the underlying/exposed low k dielectric material, nor cause faceting of a hardmask material present between the photoresist material and the low k dielectric material.

The present invention provides a two-step process for stripping, i.e., removing, photoresist material from a substrate, wherein the substrate includes a low k dielectric material underlying the photoresist material. In one embodiment, the substrate is represented as a semiconductor wafer. It should be understood that the terms substrate, semiconductor wafer, and wafer are synonymous terms in the present description. In addition to including the low k dielectric material, the substrate is also characterized as having a polymer film or polymer layer overlying both the photoresist material and the low k dielectric material. The polymer film is a byproduct of a wafer fabrication process, e.g., plasma etching process, performed prior to the photoresist stripping process. In one embodiment, the polymer film is characterized as including either a fluorocarbon component or a hydrofluorocarbon component.

The first step of the two-step process for stripping the photoresist material uses an oxygen plasma to remove the polymer film without adversely damaging or removing the underlying low k dielectric material. The second step of the two-step process uses an ammonia plasma to remove the photoresist material without adversely damaging or removing the underlying low k dielectric material. It should be appreciated that the second step commences after completion of the first step. Additionally, it should be appreciated that each step of the two-step photoresist stripping process is respectively defined by particular values for process parameters including chemistry, temperature, pressure, gas flow rate, radio frequency power, and duration. In the two-step photoresist stripping process, the above-mentioned process parameters are defined to simultaneously satisfy the following requirements:

uniformly remove the photoresist material without adversely damaging the underlying low k dielectric material, remove photoresist material at a commercially competitive rate, completely remove photoresist material without leaving essentially any residue behind, and remove photoresist material without causing essentially any physical damage or faceting of hardmask material if present.

Prior to describing in detail the two-step photoresist stripping process, it is instructive to describe a chamber in which the two-step photoresist stripping process can be conducted. FIG. 1 is an illustration showing an exemplary plasma etching chamber ("chamber") 100, in accordance with one embodiment of the present invention. The chamber 100 includes a radio frequency (RF) driven electrode 101 and a passive electrode 103. The RF-driven electrode 101 is configured to support a wafer 105 in exposure to a plasma to be generated within the chamber 100. A low frequency RF generator 113 and a high frequency RF generator 115 are provided to supply low and high frequency RF currents, respectively, to the RF-driven electrode 101, via a conductive connection 111. In one embodiment, the low frequency RF current is generated to have a frequency of 2 MHz, and the high frequency RF current is generated to have a frequency of 27 MHz. It should be appreciated, however, that the present invention can be implemented using RF power generated at frequencies other than 2 MHz and 27 MHz. For example, in a low density plasma chamber, RF power may be generated at a kiloHertz (kHz) level. Conversely, in a high density plasma chamber, RF power may be generated at a gigaHertz (GHz) level. Furthermore, it should be appreciated that the two-step photoresist stripping process of the present invention can be implemented using either a multiple frequency chamber, as described with respect to FIG. 1, or a single frequency chamber.

With regard to FIG. 1, during operation the high frequency and low frequency RF currents are transmitted from the RF-driven electrode 101 through the plasma region of the chamber 100 to the passive electrode 103, as indicated by arrows 117. It should be noted that the plasma region of the chamber is defined between the wafer 105, the RF-driven electrode 101 outside the wafer 105, the passive electrode 103, and confinement rings 121. Additionally, the high frequency and low frequency RF currents are transmitted from the RF-driven electrode 101 through the plasma region to ground extensions 107 and 109, as indicated by arrows 119.

During operation, a processing gas is flowed through the plasma region of the chamber 100, via a gas supply port (not shown) and gas exhaust port (not shown). The high frequency and low frequency RF currents transmitted through the plasma region serve to transform the processing gas into a reactive form including both ions and radicals of the processing gas material constituents. It should be appreciated that the reactive form of the processing gas is defined to have characteristics of a plasma. The high frequency RF current influences a density of the plasma in the chamber 100, while the low frequency RF current influences a voltage in the chamber 100, wherein the voltage affects ion energy within the plasma. A power supplied to the low frequency RF generator 113 and the high frequency RF generator 115 can be adjusted to increase or decrease the plasma density and the ion energy within the plasma. The ions and radicals within the plasma interact with wafer 105 materials to cause a change in the properties of the wafer 105 surface exposed to the plasma.

Additionally, a geometric relationship between the RF-driven electrode 101 and the passive electrode 103 influences a bias voltage present at the wafer 105. For example, as an upper surface area of the RF-driven electrode 101 is decreased with respect to a bottom surface area of the passive electrode 103, the bias voltage at the RF-driven electrode 101 will increase, vice-versa. Because the wafer 105 is supported by the RF-driven electrode 101, an increase in bias voltage at the RF-driven electrode 101 will cause a corresponding increase in bias at the wafer 105. As the bias at the wafer 105 is increased, the ion velocity and directionality upon impact with the wafer 105 increases. Increased ion velocity and directionality are preferable in certain processes, such as high aspect ratio etching. However, other processes such as trench etching are optimized with decreased ion velocity and directionality.

The plasma processing chamber used in conjunction with the two-step photoresist stripping process of the present invention provides for processing gas flow rate control, temperature control, pressure control, RF power control, and process duration control. The dual frequency plasma processing chamber 100, as described with respect to FIG. 1, represents an exemplary chamber within which the two-step photoresist stripping process of the present invention can be conducted. However, it should be understood that the two-step photoresist stripping process of the present invention can be conducted in essentially any plasma processing chamber suitable for semiconductor wafer fabrication, as known to those skilled in the art.

Figure 2A:
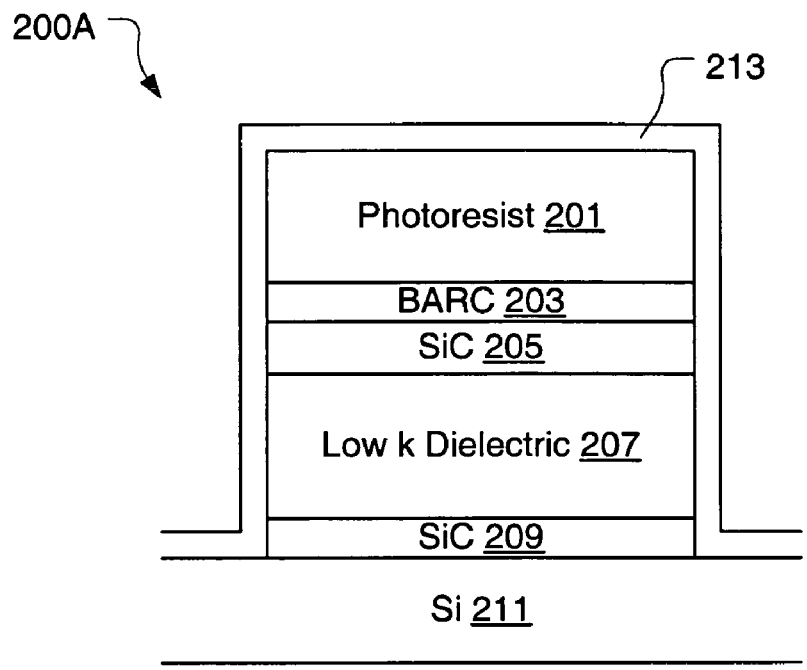
FIG. 2A is an illustration showing an idealized feature defined on a substrate to be processed in accordance with the two-step stripping process of the present invention.
Figure 2B:
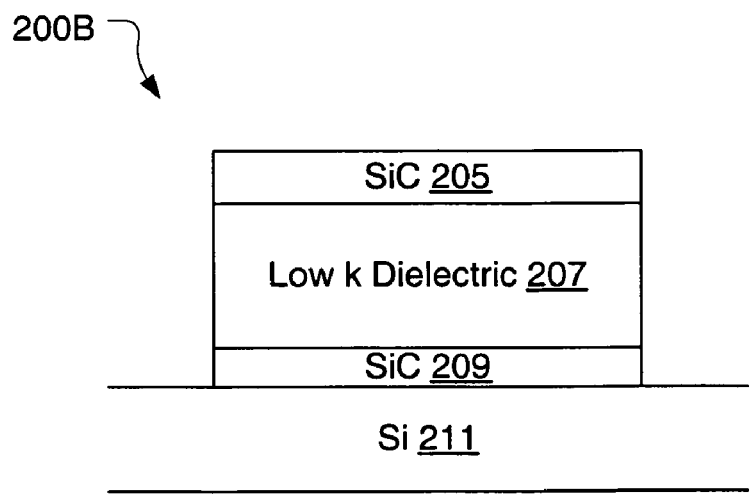
FIG. 2B is an illustration showing an idealized feature corresponding to the feature of FIG. 2A having the polymer layer, the photoresist layer, and the BARC layer removed.

FIG. 2A is an illustration showing an idealized feature 200A defined on a substrate to be processed in accordance with the two-step stripping process of the present invention. The feature 200A includes a photoresist material 201 overlying a low k dielectric material 207. It should be appreciated that the low k dielectric material can be either porous or dense/regular. In the example of FIG. 2A, a SiC hardmask material 205 and a bottom anti-reflective coating (BARC) material 203 are disposed between the photoresist material 201 and the low k dielectric material 207. Additionally, the low k dielectric material 207 is defined over a SiC material 209. The entire feature 200A is defined on a Si substrate 211. Furthermore, a polymer layer 213, also called a polymer film, is defined over both the photoresist material 201 and the low k dielectric material 207. The polymer layer 213 represents a by-product of a previous etching process. In one embodiment, the polymer layer 213 is defined to include either a fluorocarbon or a hydrofluorocarbon component. To proceed with semiconductor fabrication from the feature 200A, it is necessary to remove the polymer layer 213, the photoresist layer 201, and the BARC layer 203. FIG. 2B is an illustration showing an idealized feature 200B corresponding to the feature 200A having the polymer layer 213, the photoresist layer 201, and the BARC layer 203 removed.

Figure 3:
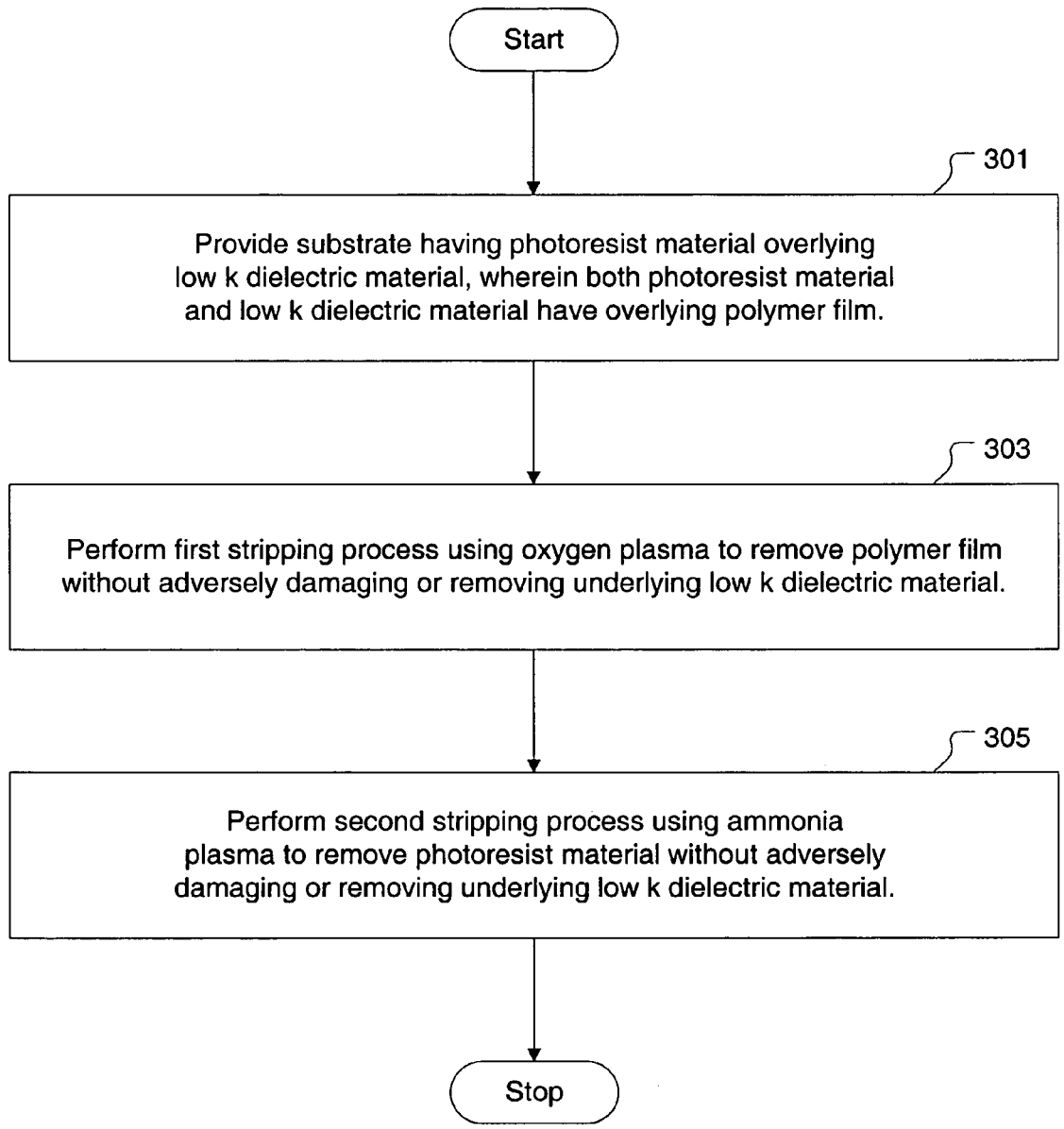
FIG. 3 is an illustration showing a flowchart of a method for removing the photoresist material from the substrate, in accordance with one embodiment of the present invention.

FIG. 3 is an illustration showing a flowchart of a method for removing the photoresist material 201 from the substrate, in accordance with one embodiment of the present invention. It should be appreciated that the method described with respect to FIG. 3 represents one embodiment of the previously mentioned two-step process for stripping photoresist material from a substrate. The method includes an operation 301 for providing a substrate having a photoresist material overlying a low k dielectric material. Both the photoresist material and the low k dielectric material have an overlying polymer film. In one embodiment, the polymer film includes either a fluorocarbon component or a hydrofluorocarbon component.

The method also includes an operation 303 for performing a first stripping process using an oxygen plasma to remove the polymer film without adversely damaging or removing the underlying low k dielectric material. The first stripping process includes disposing oxygen ($O_2$) gas over the substrate. In one embodiment, the oxygen gas is disposed at a flow rate within a range extending from about 50 standard cubic centimeters per minute (sccm) to about 1000 sccm. As used herein, the term "about" means within ± 10% of a specified value. In another embodiment, the oxygen gas is disposed at a flow rate within a range extending from about 100 sccm to about 500 sccm. In yet another embodiment, the oxygen gas is disposed at a flow rate of about 200 sccm.

The first stripping process also includes applying radio frequency (RF) power to the oxygen gas disposed over the substrate. In one embodiment, the RF power applied to the oxygen gas is within a range extending from about 50 Watts (W) to about 2000 W. In another embodiment, the RF power applied to the oxygen gas is within a range extending from about 100 W to about 1000 W. In yet another embodiment, the RF power applied to the oxygen gas is within a range extending from about 200 W to about 1000 W. The applied RF power serves to transform the oxygen gas into the oxygen plasma, wherein the oxygen plasma represents a reactive form of oxygen capable of removing the polymer film.

The first stripping process further includes maintaining a pressure within a region including the substrate and the oxygen plasma. In one embodiment, the pressure during the first stripping process is maintained within a range extending from about 5 millitorr (mT) to about 500 mT. In another embodiment, the pressure during the first stripping process is maintained within a range extending from about 5 mT to about 100 mT. In yet another embodiment, the pressure during the first stripping process is maintained within a range extending from about 5 mT to about 20 mT.

In the embodiment wherein the polymer film includes either the fluorocarbon or hydrofluorocarbon component, a fluorine component from the reaction of the oxygen plasma with the polymer can be monitored to detect an endpoint of the first stripping process. For example, the endpoint of the first stripping process will be coincident with a plateau of a fluorine concentration in the oxygen plasma. Upon determining that a substantially complete removal of the polymer film has been obtained, the first stripping process is concluded by terminating the disposal of oxygen gas over the substrate.

The method further includes an operation 305 for performing a second stripping process using an ammonia plasma to remove the photoresist material without adversely damaging or removing the underlying low k dielectric material. It should be appreciated that the second stripping process commences after completion of the first stripping process. The second stripping process includes disposing ammonia ($NH_3$) gas over the substrate. In one embodiment, the ammonia gas is disposed at a flow rate within a range extending from about 50 sccm to about 2000 sccm. In another embodiment, the ammonia gas is disposed at a flow rate within a range extending from about 100 sccm to about 1000 sccm. In yet another embodiment, the ammonia gas is disposed at a flow rate within a range extending from about 200 sccm to about 800 sccm.

The second stripping process also includes applying RF power to the ammonia gas disposed over the substrate. In one embodiment, the RF power applied to the ammonia gas is within a range extending from about 50 W to about 2000 W. In another embodiment, the RF power applied to the ammonia gas is within a range extending from about 100 W to about 1000 W. In yet another embodiment, the RF power applied to the ammonia gas is within a range extending from about 200 W to about 1000 W. The applied RF power serves to transform the ammonia gas into the ammonia plasma, wherein the ammonia plasma represents reactive forms of ammonia constituents that are capable of removing the photoresist material.

The second stripping process further includes maintaining a pressure within a region including the substrate and the ammonia plasma. The pressure maintained during the second stripping process is dependent upon the dielectric constant of the low k dielectric material. If the low k dielectric material has a dielectric constant value less than about 2.5, i.e., porous low k dielectric material, the pressure is maintained within a range extending from about 5 mT to about 500 mT during the second stripping process, in accordance with one embodiment. In another embodiment wherein the dielectric constant of the low k dielectric material is less than about 2.5, the pressure is maintained within a range extending from about 5 mT to about 100 mT during the second stripping process. In yet another embodiment wherein the dielectric constant of the low k dielectric material is less than about 2.5, the pressure is maintained within a range extending from about 5 mT to about 20 mT during the second stripping process.

However, if the low k dielectric material has a dielectric constant value greater than or equal to about 2.5, i.e., dense/regular low k dielectric material, the pressure is maintained within a range extending from about 5 mT to about 1000 mT during the second stripping process, in accordance with one embodiment. In another embodiment wherein the dielectric constant value of the low k dielectric material is greater than or equal to about 2.5, the pressure is maintained within a range extending from about 100 mT to about 500 mT during the second stripping process. In yet another embodiment wherein the dielectric constant value of the low k dielectric material is greater than or equal to about 2.5, the pressure is maintained at about 200 mT during the second stripping process.

Additionally, during each of the first and second stripping processes of operations 303 and 305, respectively, a temperature of a support upon which the wafer is disposed is maintained within a range extending from about −40° Celsius (C.) to about 60° C., in accordance with one embodiment. In another embodiment, the temperature of the support upon which the wafer is disposed is maintained within a range extending from about 0° C. to about 40° C. In yet another embodiment, the temperature of the support upon which the wafer is disposed is maintained at about 20° C.

In one embodiment, the method includes performing of an overstrip process following completion of the second stripping process. The overstrip process is performed in the same manner as the second stripping process. It should be appreciated that completion of the second stripping process can be determined using an endpoint detection technology such as plasma spectral analysis. For example, in one embodiment the endpoint of the second stripping process can be identified by observing a CN emission line at a wavelength of about 420 nanometers. Following completion of the second stripping process, as determined by endpoint detection, the overstrip process is performed for a duration within a range extending from about 10% of the duration of the second stripping process extending to the endpoint thereof to about 200% of the duration of the second stripping process extending to the endpoint thereof. In another embodiment, the overstrip process is performed for a duration within a range extending from about 50% of the duration of the second stripping process extending to the endpoint thereof to about 100% of the duration of the second stripping process extending to the endpoint thereof. In yet another embodiment, the overstrip process is performed for a duration corresponding to about 50% of the duration of the second stripping process extending to the endpoint thereof.

The photoresist material stripping rate afforded by the above-described method is dependent upon the stripping process parameters as discussed above. In various embodiments, a photoresist material stripping rate greater than about 5000 Å per minute (Å/min) can be expected from the two-step stripping process of the present invention. Additionally, the two-step stripping process of the present invention provides a uniform strip rate across the wafer. For example, the two-step stripping process of the present invention can be expected to provide a three standard deviation uniformity in strip rate of less than 5% across a 300 millimeter wafer.

Figure 4A:
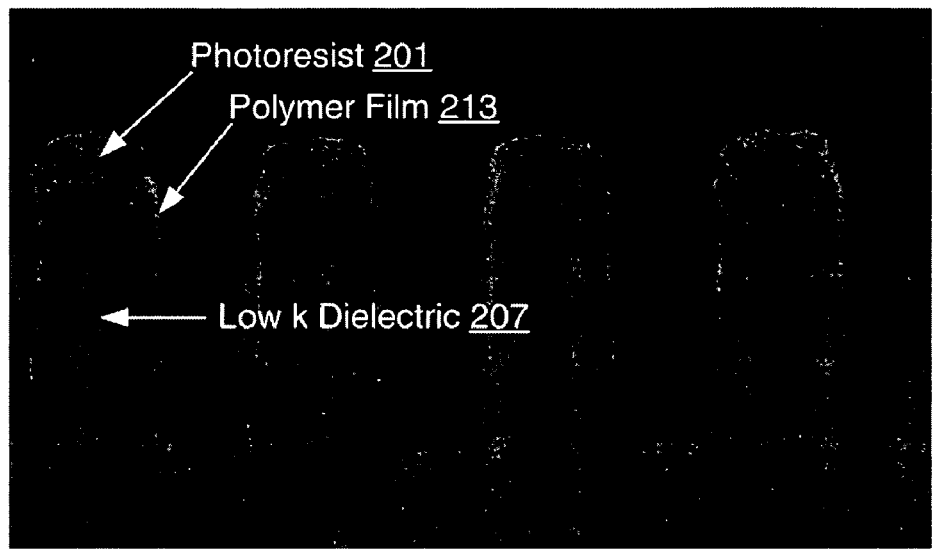
FIG. 4A is an illustration showing an image of a sample wafer surface prior to performing the two-step stripping process, in accordance with one embodiment of the present invention.
Figure 4B:
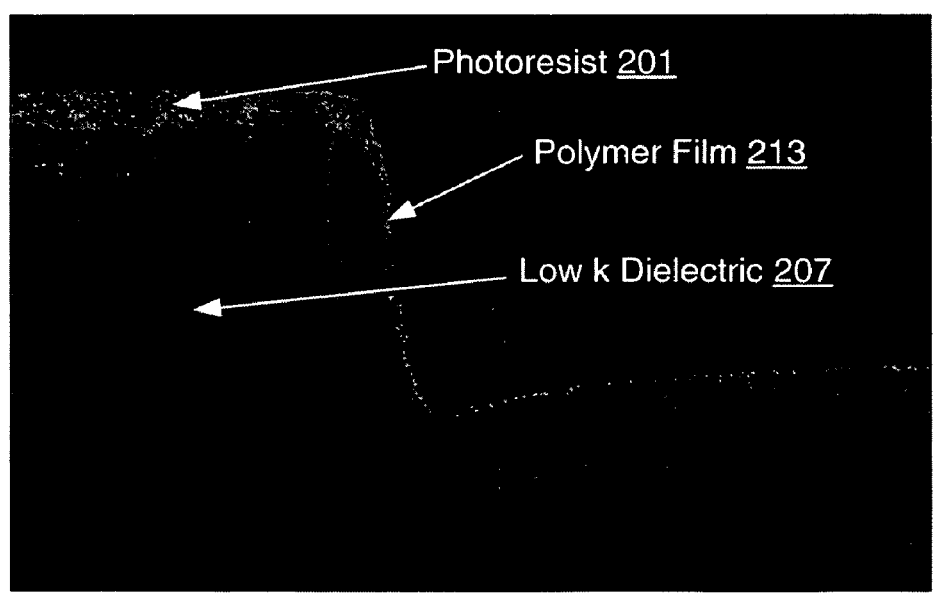
FIG. 4B is an illustration showing another image of the sample wafer surface prior to performing the two-step stripping process.

FIG. 4A is an illustration showing an image of a sample wafer surface prior to performing the two-step stripping process, in accordance with one embodiment of the present invention. The sample wafer surface is defined by a number of features that each have a photoresist material layer 201 overlying a low k dielectric material layer 207, wherein a SiC hardmask layer is defined between the photoresist material and the low k dielectric material. A polymer film 213 is disposed over the photoresist material 201, the SiC hardmask, and the low k dielectric material 207. FIG. 4B is an illustration showing another image of the sample wafer surface prior to performing the two-step stripping process. The photoresist material layer 201, the SiC hardmask, the low k dielectric layer 207, and the overlying polymer film 213 are each present in the image of FIG. 4B. Table 1 describes the stripping process parameter values used in performing the two-step stripping process on the sample wafer of FIGS. 4A-4B.

TABLE 1

Stripping Process Parameter Values for Sample Wafer

| Step | Chemistry | Flow Rate (sccm) | Pressure (mT) | RF Power | Time (seconds) |
|---|---|---|---|---|---|
| 1 | $O_2$ | 200 | 10 | 600 W | 15 |
| 2 | $NH_3$ | 600 | 200 | 600 W | 45 |
| Overstrip | $NH_3$ | 600 | 200 | 600 W | 150% of Step 2 Time |

Figure 5A:
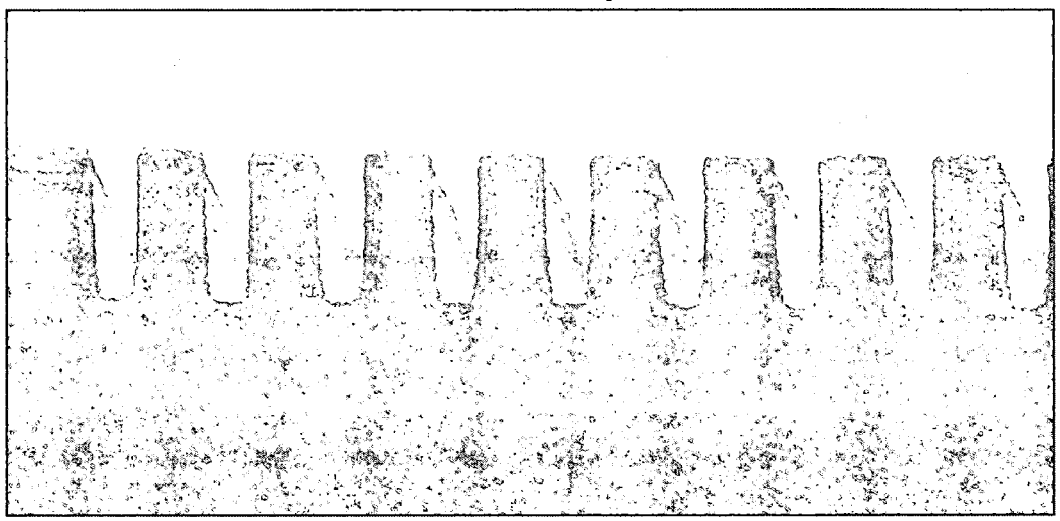
FIGS. 5A and 5B are illustrations showing images of the sample wafer of FIGS. 4A and 4B following performance of the two-step stripping process as described in Table 1.
Figure 5B:
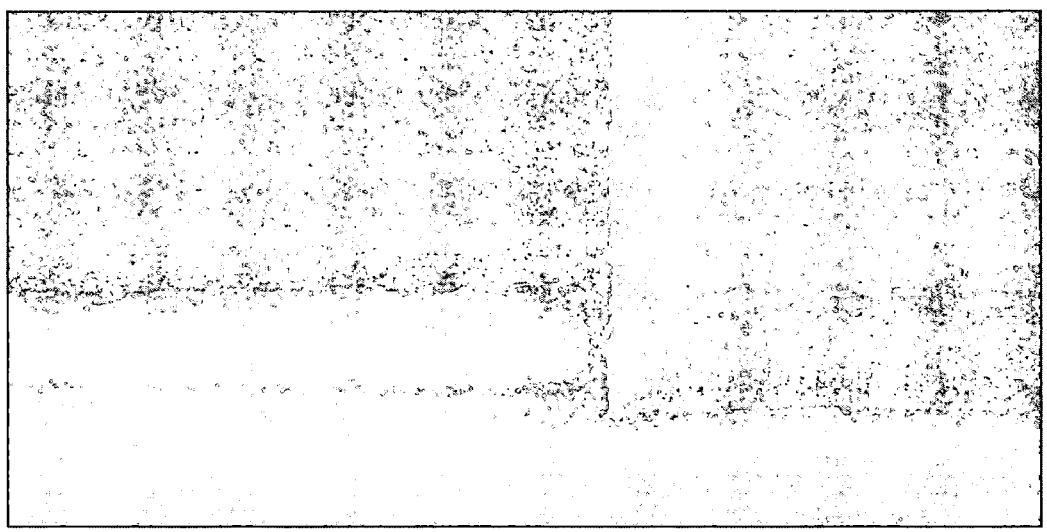
Figure 6A:
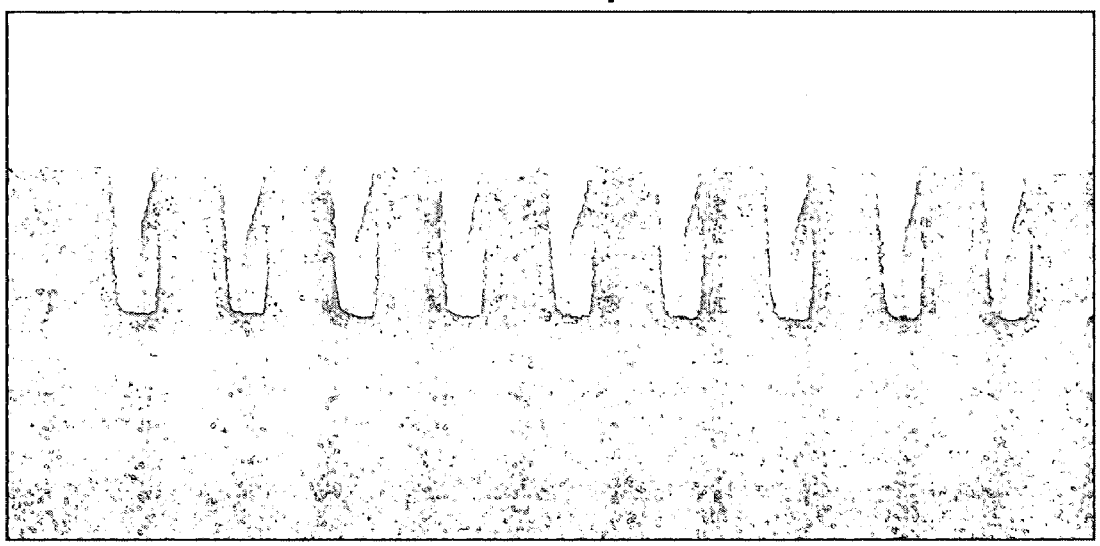
FIGS. 6A and 6B are illustrations showing images of the sample wafer of FIGS. 5A and 5B following performance of a hydrofluoric acid dip.
Figure 6B:
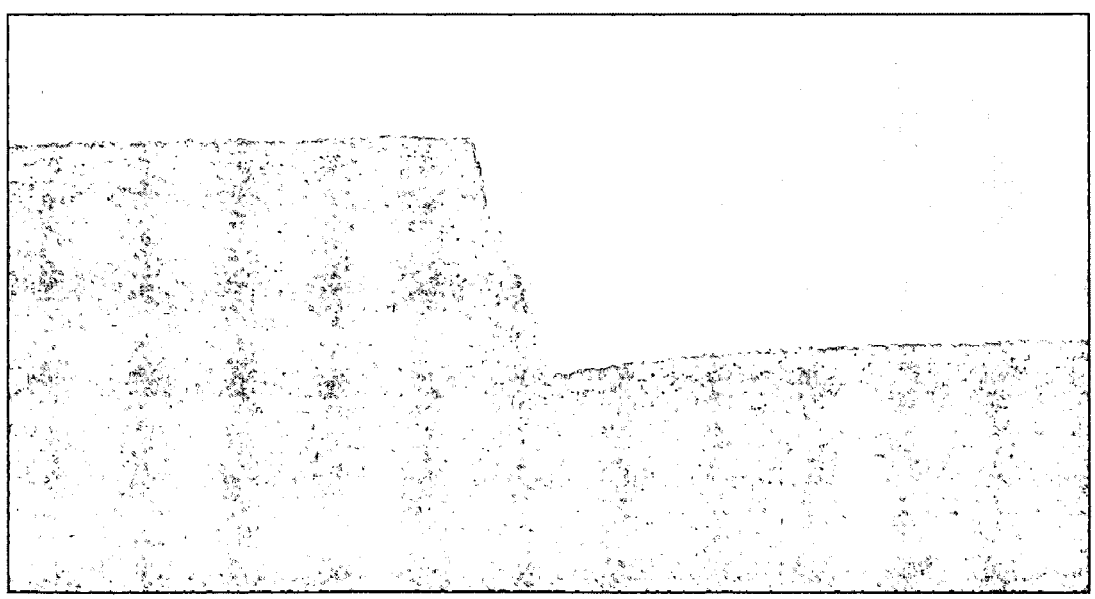

FIGS. 5A and 5B are illustrations showing images of the sample wafer of FIGS. 4A and 4B following performance of the two-step stripping process as described in Table 1. As indicated by FIGS. 5A-5B, it should be appreciated that the two-step stripping process of the present invention leaves essentially no residue. FIGS. 6A and 6B are illustrations showing images of the sample wafer of FIGS. 5A and 5B following performance of a hydrofluoric acid (HF) dip. The HF dip serves to remove any remaining materials altered by the stripping process. As indicated by FIGS. 6A-6B, it should be appreciated that the two-step stripping process of the present invention incurs essentially no low k material damage. Additionally, the two-step stripping process of the present invention prevents a type of feature damage characterized by corner faceting, wherein upper corners of each feature are cut off, i.e., faceted. Thus, the method for removing photoresist material from a substrate as provided by the present invention avoids damage to low k dielectric material present on the substrate while providing a high strip rate and excellent across-wafer uniformity, without faceting the hardmask material.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for removing photoresist material from a substrate, comprising:
    providing a substrate having a photoresist material overlying a low k dielectric material, wherein both the photoresist material and the low k dielectric material have an overlying polymer film;
    performing a first stripping process using an oxygen plasma to remove the polymer film without adversely damaging or removing the underlying low k dielectric material; and
    performing a second stripping process using an ammonia plasma to remove the photoresist material without adversely damaging or removing the underlying low k dielectric material, wherein the second stripping process is performed after completion of the first stripping process.

2. A method for removing photoresist material from a substrate as recited in claim 1, wherein the polymer film includes a fluorocarbon component or a hydrofluorocarbon component, wherein a fluorine component resulting from reaction of the polymer film with the oxygen plasma is monitored to detect an endpoint of the first stripping process, the endpoint of the first stripping process being coincident with a plateau of a fluorine concentration in the oxygen plasma.

3. A method for removing photoresist material from a substrate as recited in claim 1, further comprising:
    detecting an endpoint of the second stripping process;
    performing an overstrip process following the endpoint of the second stripping process, the overstrip process having a duration within a range extending from about 10% of a duration of the second stripping process extending to the endpoint to about 200% of the duration of the second stripping process extending to the endpoint, wherein the overstrip process is performed in the same manner as the second stripping process.

4. A method for removing photoresist material from a substrate as recited in claim 1, wherein the first stripping process includes disposing oxygen gas over the substrate at a flow rate within a range extending from about 50 standard cubic centimeters per minute (sccm) to about 1000 sccm, and applying radio-frequency (RF) power within a range extending from about 50 Watts (W) to about 2000 W to the oxygen gas to transform the oxygen gas into the oxygen plasma.

5. A method for removing photoresist material from a substrate as recited in claim 1, wherein a hardmask material is defined between the photoresist material and the low k dielectric material.

6. A method for removing photoresist material from a substrate as recited in claim 5, wherein each of the first and second stripping processes are performed without faceting the hardmask material.

7. A method for removing photoresist material from a substrate as recited in claim 1, wherein the second stripping process includes disposing ammonia gas over the substrate at a flow rate within a range extending from about 50 standard cubic centimeters per minute (sccm) to about 2000 sccm, and applying radio-frequency (RF) power within a range extending from about 50 Watts (W) to about 2000 W to the ammonia gas to transform the ammonia gas into the ammonia plasma.

8. A method for removing photoresist material from a substrate as recited in claim 1, wherein the first stripping process includes maintaining a pressure within a region including the substrate and the oxygen plasma within a range extending from about 5 millitorr (mT) to about 500 mT.

9. A method for removing photoresist material from a substrate as recited in claim 1, wherein the second stripping process includes maintaining a pressure within a region including the substrate and the oxygen plasma within a range extending from about 5 millitorr (mT) to about 500 mT when the low k dielectric material has a dielectric constant value less than 2.5,
    wherein the second stripping process includes maintaining a pressure within a region including the substrate and the oxygen plasma within a range extending from about 5 mT to about 1000 mT when the low k dielectric material has a dielectric constant value greater than or equal to 2.5.

10. A method for removing photoresist material from a substrate as recited in claim 1, further comprising:
    maintaining a temperature of a chuck upon which the substrate is supported within a range extending from about −40° Celsius (C) to about 60° C.

11. A method for removing photoresist material from a substrate, comprising:
    providing a substrate having a photoresist material overlying a low k dielectric material, wherein both the photoresist material and the low k dielectric material have an overlying polymer film that includes either a fluorocarbon component or a hydrofluorocarbon component;
    disposing oxygen gas over the substrate;
    transforming the oxygen gas into a reactive form, wherein the reactive form of oxygen affects a removal of the polymer film;
    terminating the disposal of oxygen gas over the substrate upon a substantially complete removal of the polymer film;
    disposing an ammonia gas over the substrate after terminating the disposal of oxygen gas over the substrate; and
    transforming the ammonia gas into a reactive form, wherein the reactive form of ammonia affects a removal of the photoresist material from the substrate without causing substantial damage or removal of the underlying low k dielectric material.

12. A method for removing photoresist material from a substrate as recited in claim 11, further comprising:
monitoring a fluorine concentration present within a vicinity of the substrate during disposal of the oxygen gas over the substrate, the substantially complete removal of the polymer film being coincident with a plateau of the fluorine concentration.

13. A method for removing photoresist material from a substrate as recited in claim 11, wherein the oxygen gas is disposed over the substrate at a flow rate within a range extending from about 50 standard cubic centimeters per minute (sccm) to about 1000 sccm.

14. A method for removing photoresist material from a substrate as recited in claim 11, wherein the ammonia gas is disposed over the substrate at a flow rate within a range extending from about 50 standard cubic centimeters per minute (sccm) to about 2000 sccm.

15. A method for removing photoresist material from a substrate as recited in claim 11, wherein each of the oxygen gas and the ammonia gas is transformed into the reactive form by applying radio-frequency (RF) power within a range extending from about 50 Watts (W) to about 2000 W to the respective gas.

16. A method for removing photoresist material from a substrate as recited in claim 11, further comprising:
maintaining a pressure within a region including the substrate within a range extending from about 5 millitorr (mT) to about 500 mT during disposal of the oxygen gas over the substrate;
maintaining a pressure within a region including the substrate within a range extending from about 5 mT to about 500 mT during disposal of the ammonia gas over the substrate when the low k dielectric material has a dielectric constant value less than 2.5; and
maintaining a pressure within a region including the substrate within a range extending from about 5 mT to about 1000 mT during disposal of the ammonia gas over the substrate when the low k dielectric material has a dielectric constant value greater than or equal to 2.5.

17. A method for removing photoresist material from a substrate as recited in claim 11, wherein a hardmask material is defined between the photoresist material and the low k dielectric material, the reactive forms of oxygen and ammonia respectively affecting removal of the polymer film and photoresist material from the substrate without faceting the hardmask material.

18. A method for removing photoresist material from a substrate having a low k dielectric material underlying the photoresist material, wherein both the photoresist material and the low k dielectric material have an overlying polymer film that includes either a fluorocarbon or a hydrofluorocarbon component, comprising:
exposing the polymer film to an oxygen plasma for a duration necessary to just remove the polymer film; and
following removal of the polymer film, exposing the photoresist material to an ammonia plasma for a duration necessary to completely remove the photoresist material.

19. A method as recited in claim 18, wherein exposing the polymer film to the oxygen plasma includes,
disposing an oxygen gas over the substrate at a flow rate within a range extending from about 50 standard cubic centimeters per minute (sccm) to about 1000 sccm,
applying radio-frequency (RF) power within a range extending from about 50 Watts (W) to about 2000 W to the oxygen gas to generate the oxygen plasma, and
maintaining a pressure within a region including the substrate and oxygen plasma within a range extending from about 5 millitorr (mT) to about 500 mT.

20. A method as recited in claim 18, wherein exposing the polymer film to the ammonia plasma includes,
disposing an ammonia gas over the substrate at a flow rate within a range extending from about 50 standard cubic centimeters per minute (sccm) to about 2000 sccm,
applying RF power within a range extending from about 50 Watts (W) to about 2000 W to the ammonia gas to generate the ammonia plasma,
maintaining a pressure within a region including the substrate and ammonia plasma within a range extending from about 5 millitorr (mT) to about 500 mT if the low k dielectric material has a dielectric constant value less than 2.5, and
maintaining a pressure within a region including the substrate and ammonia plasma within a range extending from about 5 mT to about 1000 mT if the low k dielectric material has a dielectric constant value greater than or equal to 2.5.

* * * * *